United States Patent
Lee

(10) Patent No.: US 12,211,562 B2
(45) Date of Patent: Jan. 28, 2025

(54) DATA ERASURE VERIFICATION FOR THREE-DIMENSIONAL NON-VOLATILE MEMORY

(71) Applicant: YANGTZE MEMORY TECHNOLOGIES CO., LTD., Wuhan (CN)

(72) Inventor: Changhyun Lee, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 202 days.

(21) Appl. No.: 18/092,069

(22) Filed: Dec. 30, 2022

(65) Prior Publication Data

US 2023/0136479 A1     May 4, 2023

Related U.S. Application Data

(63) Continuation of application No. PCT/CN2022/078785, filed on Mar. 2, 2022.

(30) Foreign Application Priority Data

Mar. 8, 2021  (CN) .......................... 202110248812.8

(51) Int. Cl.
  *G11C 16/34* (2006.01)
  *G11C 16/04* (2006.01)
  *G11C 16/14* (2006.01)

(52) U.S. Cl.
  CPC ...... *G11C 16/3445* (2013.01); *G11C 16/0483* (2013.01); *G11C 16/14* (2013.01)

(58) Field of Classification Search
  CPC .. G11C 16/3445; G11C 16/0483; G11C 16/14
  See application file for complete search history.

(56) References Cited

U.S. PATENT DOCUMENTS

2011/0316063 A1* 12/2011 Tang ................. G11C 13/0069
                                                      257/314
2014/0112074 A1*  4/2014 Rhie ...................... G11C 16/14
                                                      365/185.11

(Continued)

FOREIGN PATENT DOCUMENTS

CN     111009275 A     4/2020
CN     112908389 A     6/2021

OTHER PUBLICATIONS

Li Changxuan, Yangtze Memory Tech; CN112908389A Data erase verification for three-dimensional non-volatile memory; Jun. 4, 2021 (Year: 2021).*

(Continued)

*Primary Examiner* — Min Huang
(74) *Attorney, Agent, or Firm* — BAYES PLLC

(57) ABSTRACT

A three-dimensional non-volatile memory includes memory blocks including layers. A data method for erasure verification of the three-dimensional non-volatile memory includes selecting a first layer from the layers on which an erase operation has been performed. The method also includes applying a first local verification voltage to a word line corresponding to the first layer to verify the erase operation on the first layer. When a full block erasure verification is performed on the memory blocks corresponding to the first layer, a voltage applied to the word line corresponding to the memory blocks is a global verification voltage, and the first local verification voltage is lower than the global verification voltage.

19 Claims, 10 Drawing Sheets

(56) References Cited

U.S. PATENT DOCUMENTS

2019/0019563 A1   1/2019 Lee
2019/0102104 A1*  4/2019 Righetti ................ G06F 3/0688

OTHER PUBLICATIONS

International Search Report issued in corresponding International Application No. PCT/CN2022/078785, mailed on Jun. 2, 2022, 5 pages.

* cited by examiner

DATA ERASURE VERIFICATION FOR THREE-DIMENSIONAL NON-VOLATILE MEMORY

CROSS-REFERENCE OF RELATED APPLICATIONS

This application is a continuation of International Application No. PCT/CN2022/078785, filed on Mar. 2, 2022, which claims the benefit of priority to Chinese Application No. 202110248812.8 filed on Mar. 8, 2021, both of which are incorporated herein by reference in their entireties.

TECHNICAL FIELD

The present disclosure relates to the field of semiconductor, and also relates to a data erasure verification method for three-dimensional non-volatile memory, a data erase method for the three-dimensional non-volatile memory, and a three-dimensional non-volatile memory.

BACKGROUND

Semiconductor memories with "vertical" (i.e., in three-dimensional (3D)) stacked memory cells have recently been widely used in electronic devices, which generally include a plurality of vertically stacked layers (e.g., the top and bottom layers in three-dimensional non-volatile memory formed by a dual stack process), where a plurality of vertically stacked memory cells may be present in each layer. In order to efficiently read, write and erase in a three-dimensional non-volatile memory having a plurality of layers, each layer may be erased as a separate memory block (half block). In other words, each layer may independently perform a layered erasure verification operation.

Furthermore, since the write operation for the three-dimensional non-volatile memory can only be performed in an empty or erased memory block, therefore, erasure must be performed before writing if data already exists in the target memory block. Thus, the erasure verification operation is a basic processing step for the three-dimensional non-volatile memory.

In a layered erasure verification operation, an erasure verification voltage applied to each layer is the same as the voltage applied to all memory blocks in a full block erasure verification operation, which ultimately affects the distribution of erased memory cells. Further, too many memory cells with shallow erasing effects are included in the distribution of erased memory cells after the layered erasure verification operations.

SUMMARY

The present disclosure provides a data erasure verification method for a three-dimensional non-volatile memory, the three-dimensional non-volatile memory comprising a plurality of memory blocks, the memory blocks comprising a plurality of layers, the data erasure verification method comprising: selecting a first layer from the plurality of layers on which an erase operation has been performed, and a verification operation has not been performed, to perform a layered erasure verification; and applying a first local verification voltage to the first layer to verify the erase operation on the first layer; wherein the first local verification voltage is lower than a global verification voltage, the global verification voltage is a voltage required when a full block erasure verification is performed on the memory blocks corresponding to the first layer.

The data erasure verification method according to an implementation of the present disclosure, the three-dimensional non-volatile memory comprises two layers.

The data erasure verification method according to an implementation of the present disclosure further comprises selecting a second layer from the plurality of layers on which the erase operation has been performed, and the verification operation has not been performed, to perform the layered erasure verification; and applying a second local verification voltage to the second layer to verify the erase; wherein the second local verification voltage is lower than the global verification voltage.

The data erasure verification method according to an implementation of the present disclosure, the first layer is a top layer, the second layer is a bottom layer, the three-dimensional non-volatile memory further comprises a substrate, the bottom layer is proximate to the substrate, the first local verification voltage is lower than the second local verification voltage.

The data erasure verification method according to an implementation of the present disclosure, prior to the step of selecting the first layer from the plurality of layers on which the erase operation has been performed, and the verification operation has not been performed, the data erasure verification method further comprises: selecting a second layer from the plurality of layers; and performing a write operation or an erase operation on the second layer.

The data erasure verification method according to an implementation of the present disclosure, the first local verification voltage applied to the first layer has a first voltage value if the write operation is performed on the second layer; and the first local verification voltage applied to the first layer has a second voltage value if the erase operation is performed on the second layer, wherein the first voltage value is higher than the second voltage value.

The data erasure verification method according to an implementation of the present disclosure, the three-dimensional non-volatile memory comprises three layers.

The data erasure verification method according to an implementation of the present disclosure further comprises: selecting a second layer from the plurality of layers on which the erase operation has been performed and the verification operation has not been performed, to perform layered erasure verification; and applying a second local verification voltage to the second layer to verify the erase operation; wherein the second local verification voltage is lower than the global verification voltage.

The data erasure verification method according to an implementation of the present disclosure further comprises: selecting a third layer from the plurality of layers on which the erase operation has been performed and the verification operation has not been performed, to perform layered erasure verification; and applying a third local verification voltage to the third layer to verify the erase operation; wherein the third local verification voltage is lower than the global verification voltage.

The data erasure verification method according to an implementation of the present disclosure, the first layer is a top layer, the second layer is a middle layer, and the third layer is a bottom layer, the three-dimensional non-volatile memory further comprises a substrate, wherein the bottom layer is proximate to the substrate, wherein the first local verification voltage is lower than the second local verification voltage; and the second local verification voltage is lower than the third local verification voltage.

The data erasure verification method according to an implementation of the present disclosure, prior to the step of selecting a first layer from the plurality of layers on which the erase operation has been performed, and the verification operation has not been performed, the data erasure verification method further comprises: selecting a second layer from the plurality of layers; and performing a write operation or an erase operation on the second layer.

The data erasure verification method according to an implementation of the present disclosure, the first local verification voltage applied to the first layer has a third voltage value if the write operation is performed on the second layer; and the first local verification voltage applied to the first layer has a fourth voltage value if the erase operation is performed on the second layer, wherein the third voltage value is higher than the fourth voltage value.

The data erasure verification method according to an implementation of the present disclosure, prior to the step of selecting a first layer from the plurality of layers on which the erase operation has been performed, and the verification operation has not been performed, the data erasure verification method further comprises: selecting a third layer from the plurality of layers; and performing a write operation or an erase operation on the third layer.

The data erasure verification method according to an implementation of the present disclosure, the first local verification voltage applied to the first layer has a fifth voltage value if the write operation is performed on the third layer; and the first local verification voltage applied to the first layer has a sixth voltage value if the erase operation is performed on the third layer, wherein the fifth voltage value is higher than the sixth voltage value.

The data erasure verification method according to an implementation of the present disclosure, the first local verification voltage applied to the first layer has a seventh voltage value if the write operation is performed on the third layer; and the first local verification voltage applied to the first layer has an eighth voltage value if the erase operation is performed on the second layer and the third layer respectively, wherein the seventh voltage value is higher than the eighth voltage value.

The present disclosure further provides a data erase method for a three-dimensional non-volatile memory, the three-dimensional non-volatile memory comprising a plurality of layers, the data erase method comprising: selecting a first layer from the plurality of layers; performing an erase operation on the first layer; performing the data erasure verification method for the three-dimensional non-volatile memory of one aspect of the present disclosure; and the erasing step ends if the erasure verification succeeds.

The data erase method for the three-dimensional non-volatile memory according to an implementation of the present disclosure further comprises repeating the erase operation and performing the data erasure verification method for the three-dimensional non-volatile memory of one aspect of the present disclosure if the erasure verification fails.

The present disclosure further provides a three-dimensional non-volatile memory, comprising: a memory array comprising a plurality of memory blocks, wherein the memory blocks comprise a plurality of layers; and a control circuit coupled to the memory array and is configured to control layered selection of the plurality of layers and perform the erase operation and data erasure verification operation on the selected layers, wherein the data erasure verification operation determines whether the erase operation on the selected layers succeeds based on the data erasure verification method for the three-dimensional non-volatile memory of one aspect of the present disclosure.

The three-dimensional non-volatile memory according to an implementation according to the present disclosure, the memory array is a three-dimensional NAND memory array, and the three-dimensional non-volatile memory is a three-dimensional NAND memory.

BRIEF DESCRIPTION OF THE DRAWINGS

Implementations of the present disclosure are illustrated in the illustration of the drawings by way of example and not by way of limitation in which like reference numerals designate like elements.

DETAILED DESCRIPTION

Figure 1:
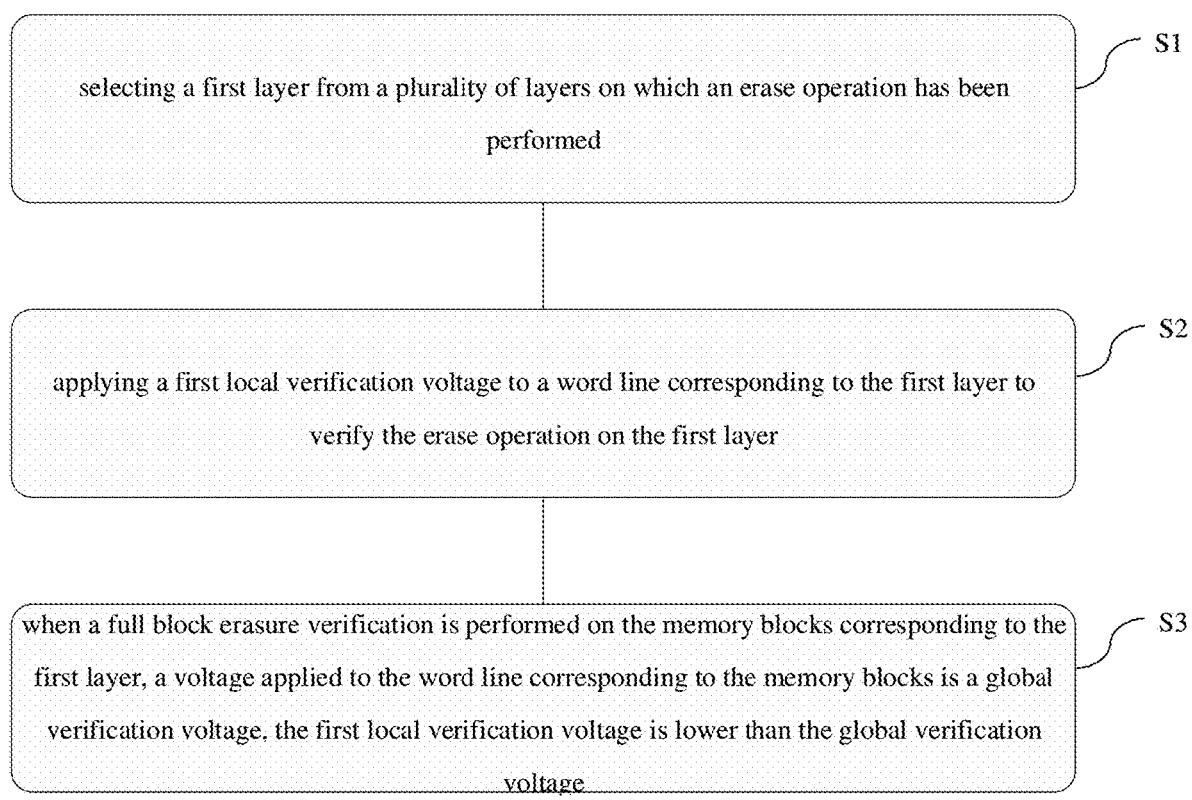
FIG. 1 is a flowchart of a data erasure verification method for a three-dimensional non-volatile memory according to an implementation of the present disclosure.

Exemplary implementations of the present disclosure will now be described more fully below with reference to the accompanying drawings, in which some implementations of the present disclosure are shown. However, the present disclosure may be embodied in different forms and should not be construed as being limited to the exemplary implementations set forth herein. Rather, these implementations are provided so that the present disclosure will be thorough and complete and will fully convey the scope of the present disclosure to those skilled in the art.

It should also be understood that when an element or layer is referred to as "on" another element or layer, "connected to" or "coupled to" another element or layer, it may be directly on or connected to another element or layer or there may be an element or layer between them. When the element or layer is referred to as "directly on" another element or layer, "directly connected to" or "directly coupled to" another element or layer, there is no intermediate element or layer there between. For this purpose, the term "connecting"

may refer to a physical connection, an electrical connection and/or a fluid connection with or without an intervening element.

Throughout the specification, like reference numerals denote like components. The thickness of layers and regions is exaggerated for clarity in the drawings.

Although the terms such as "first," "second," and the like may be used herein to describe various elements, these elements should not be limited by these terms. These terms can be used to distinguish one element from another. Thus, the first element discussed below may be referred to as a second element without departing from the teachings of one or more implementations. Describing an element as a "first" element may not require or imply the presence of a second element or other elements. The terms "first," "second," and the like may also be used herein to distinguish elements of different classes or groups. For the sake of brevity, the terms "first," "second," and the like may mean "first class (or first group)," "second class (or second group)," etc., respectively.

The terms used herein are for the purpose of describing specific implementations only and are not intended to be limiting. The term "and/or" as used herein includes any and all combinations of one or more of the associated listed items. It should also be understood that when used in this specification, the term "including" specifies the presence of the illustrated feature, region, step, operation, elements and/or components but does not exclude the presence or addition of one or more other feature, region, step, operation, element, components and/or groups thereof.

In addition, the relative terms such as "lower" or "bottom" and "upper" or "top" may be used herein to describe the relationship of one element to another as shown in the figures. It should be understood that relative terms are intended to encompass different orientations of the device in addition to the orientations depicted in the figures. In an exemplary implementation, when the device in one of the figures is flipped, elements described as being on the "lower" side of the other elements will then be oriented on the "upper" side of the other elements. Thus, the exemplary term "lower" may encompass both "lower" and "upper" orientations depending on the particular orientation of the figures. Similarly, when the device in one of the figures is flipped, elements described as "below" or "under" the other elements will then be oriented "above" the other elements. Thus, the exemplary term "below" or "under" may encompass both below and above orientations.

Figure 2:
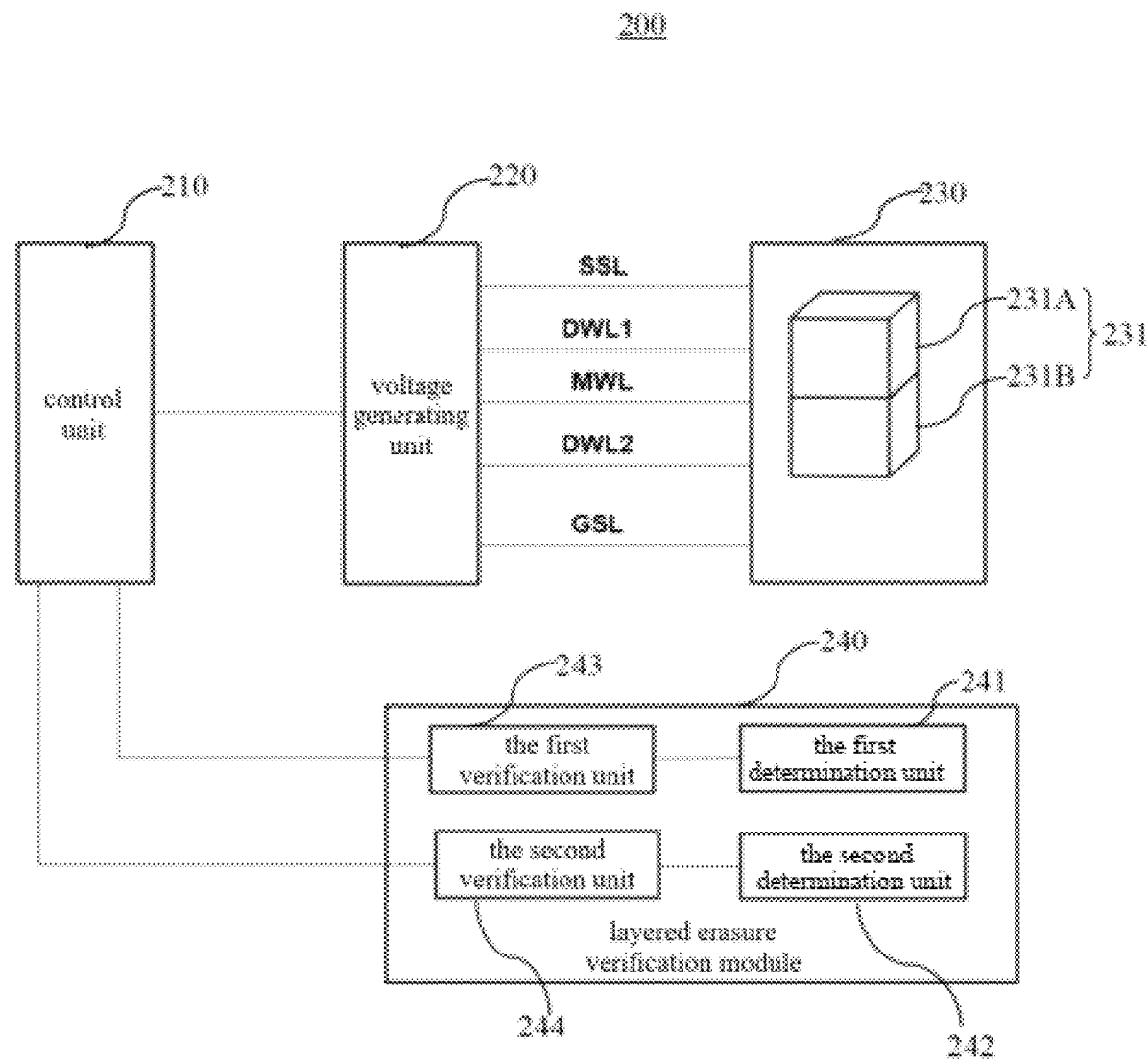
FIG. 2 is a block diagram of a three-dimensional non-volatile memory according to an implementation of the present disclosure.

FIG. 2 is a block diagram of a three-dimensional non-volatile memory 200 according to an implementation of the present disclosure. As shown in FIG. 2, the three-dimensional non-volatile memory 200 may include a control unit 210, a voltage generating unit 220, a memory array 230, and a layered erasure verification module 240. The memory array 230 may include a plurality of memory blocks 231 each including a plurality of layers (or referred to "decks"). The control unit 210 and the layered erasure verification module 240 may together constitute a control circuit (not shown) of the three-dimensional non-volatile memory 200. The control circuit may be coupled to the memory array 230. The control circuitry may be configured to control layer selection of a plurality of layers of the memory array 230 and to perform an erase operation and a data erasure verification operation on the selected layers.

In an implementation of the present disclosure, the three-dimensional non-volatile memory 200 may be a three-dimensional NAND memory, and the memory array 230 may be a three-dimensional NAND memory array. However, the memory is not limited to the three-dimensional NAND memory, and the memory array is not limited to the three-dimensional NAND memory array. The memory and the memory array may be implemented as other various types of non-volatile memory and non-volatile memory arrays capable of retaining stored data when power is turned down, respectively, without departing from the disclosure or teachings of the present disclosure.

In an implementation of the present disclosure, the control circuit may control operations such as write, read, erase, and erasure verification performed on the memory array 230. The control circuit may include a controller constructed in a peripheral circuit of the non-volatile memory chip. Further, the control circuit may perform the various operations described above in accordance with the acquired computer program instructions.

Further, since the write operation of the memory array 230 is performed within empty or erased memory blocks, thus if there is already data in the target memory block, it is generally necessary to erase first and then write. Therefore, the erasure verification operation is one of the basic operations of the three-dimensional non-volatile memory 200.

In one implementation of the present disclosure, the memory blocks 231 may include a substrate and a plurality of layers (e.g., the top layer 231A and the bottom layer 231B) vertically stacked on the substrate, wherein a plurality of vertically stacked memory cells may exist in each layer (which will be further described later with reference to FIG. 3). In order to efficiently read, write and erase in the memory blocks 231 having the plurality of layers, each layer may be erased as a separate memory block (half block).

As an option, the control unit 210 may control the voltage generating unit 220 to supply the voltage configured for the above operations to the memory array 230. Based on the fact that each layer of the memory array 230 may separately perform a data erase operation and a data erasure verification operation independently from other layers, the control unit 210 may select from the plurality of layers of the memory array 230 at a data erase phase and a data erasure verification phase of the memory array 230, to select the layer or memory cells to be erased or verified, and control the voltage generating unit 220 to apply an appropriate voltage to the layer or memory cells to be erased or verified in the memory array 230.

Specifically, in the data erasure verification operation, the control unit 210 may select from the plurality of layers of the memory array 230, and control the voltage generating unit 220 to supply a local erasure verification voltage (Vver) to the selected layers and a pass voltage (Vpass) to the unselected layers.

In an implementation of the present disclosure, the voltage generating unit 220 may generate a control voltage based on a control signal received from the control unit 210 or obtain a suitable voltage from another external source, which is not limited in the implementation of the present disclosure. In an implementation of the present disclosure, the layered erasure verification module 240 may include a determination unit and a verification unit, wherein the determination unit (e.g., the first determination unit 241 and the second determination unit 242) is configured to determine whether the erase operation on the selected plurality of layers in the memory array 230 succeeds based on the data erasure verification method for the three-dimensional non-volatile memory provided by the present disclosure.

In an implementation of the present disclosure, the first determination unit 241 may determine whether the erase operation on the selected top layer 231A in the memory blocks 231 succeeds based on the data erasure verification method for the three-dimensional non-volatile memory provided by the present disclosure. Similarly, the second determination unit 242 may determine whether the erase operation on the selected bottom layer 231B in the memory block 231 succeeds based on the data erasure verification method for the three-dimensional non-volatile memory provided in the present disclosure.

The verification unit (e.g., the first verification unit 243 and the second verification unit 244) is configured to perform a re-erase operation in the respective layers that fail to pass the above erasure verification operation.

In one implementation of the present disclosure, the first verification unit 243 may perform the re-erase operation on the top layer 231A that fails to pass the layered erasure verification operation; accordingly, the second verification unit 244 may perform the re-erase operation on the bottom layer 231B that fails to pass the layered erasure verification operation.

The three-dimensional non-volatile memory structure including two layers is described above. In fact, with the increasing demand of storage capacity of three-dimensional non-volatile memory, the memory layers gradually increase. A multi-stack technique may be employed to form the three-dimensional non-volatile memory having a plurality of layers vertically stacked on the substrate (e.g., a three-stack structure including a top layer, a middle layer, and a bottom layer). However, it will be understood by those skilled in the art that the content and structure involved in describing the three-dimensional non-volatile memory comprising two layers above may be fully or partially applicable to the three-dimensional non-volatile memory comprising multiple layers, therefore content related to or similar thereto will not be repeated.

Hereinafter, a data erasure verification method applicable to the above-mentioned three-dimensional non-volatile memory provided by an implementation of the present disclosure will be described in detail with reference to the accompanying drawings. FIG. 3 is a schematic structural diagram of a memory block 400 having a plurality of layers according to an implementation of the present disclosure.

As an example, the memory block 400 may include a substrate 330, a bottom layer 450, and a top layer 452. The bottom layer 450 and the top layer 452 are stacked in a direction perpendicular to the substrate 330. The bottom layer 450 is proximate to the substrate 330, and the top layer 452 is disposed on the top (away from the substrate 330) of the bottom layer 450.

Figure 3:
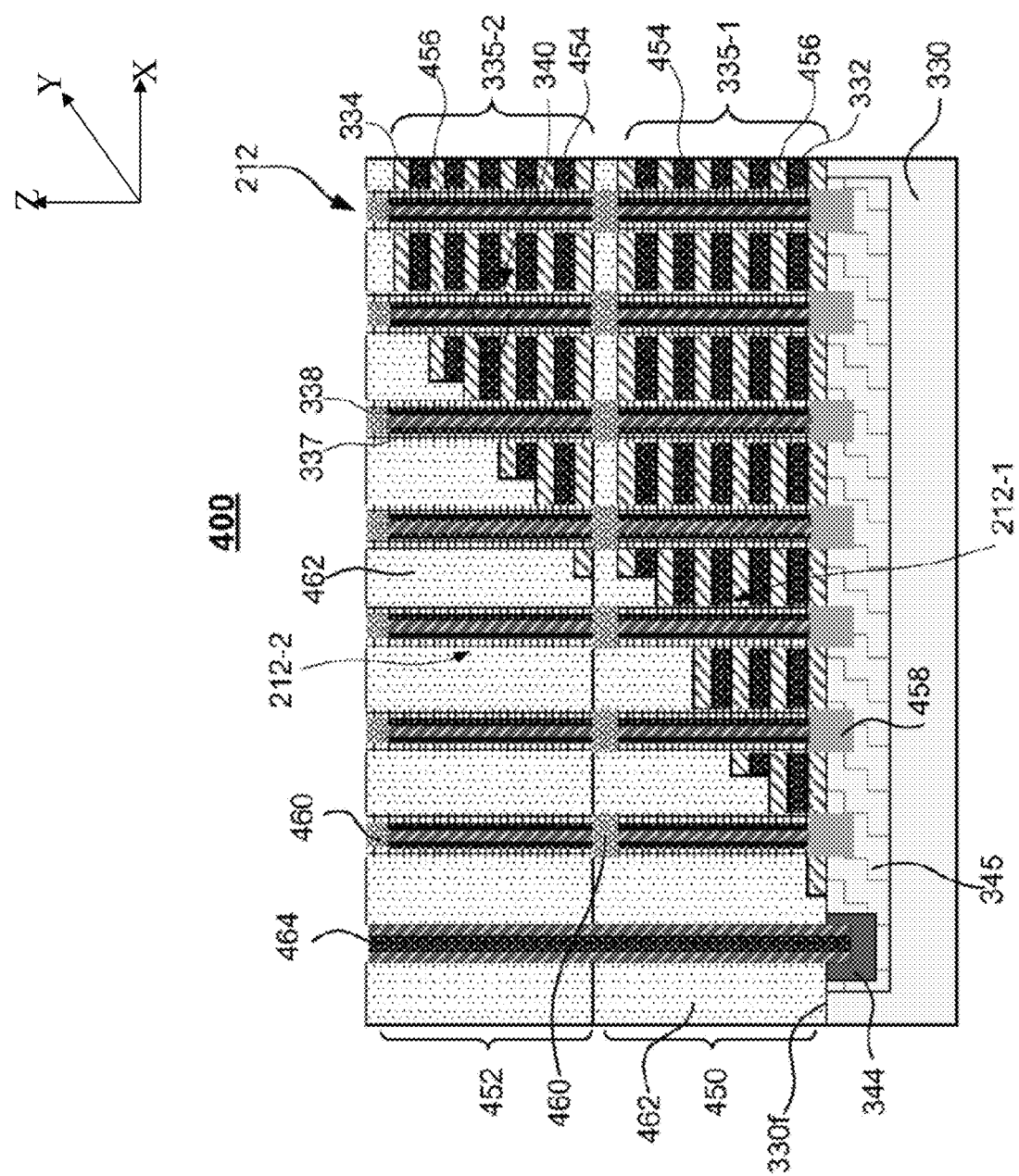
FIG. 3 is a schematic diagram of a hierarchical structure of a three-dimensional memory block according to an implementation of the present disclosure.

In FIG. 3, the X and Y directions may be directions of the word line (WL) and bit line (BL) of the memory block 400, and the Z direction may be the direction orthogonal to the X and Y directions.

In some implementations, the substrate 330 may provide a platform configured to form a subsequent structure. In some implementations, the substrate 330 may be any suitable semiconductor substrate having any suitable semiconductor material, such as a single crystal polycrystalline or a single crystal semiconductor. For example, the substrate 330 may include silicon, silicon-germanium (SiGe), germanium (Ge), silicon-on-insulator (SOI), germanium-on-insulator (GOI), gallium arsenide (GaAs), gallium nitride, silicon carbide, and III-V compound or any combination thereof. In some implementations, the substrate 330 may include a layer of semiconductor material, such as glass, plastic, or another semiconductor substrate, formed on the operating wafer.

The front surface 330f of the substrate 330 is also referred to herein as the "major surface" or "top surface" of the substrate. Stacked structures (e.g., the bottom layer 450 and the top layer 452) may be disposed on the front surface 330f of the substrate 330.

In some implementations, the bottom layer 450 and the top layer 452 include a bottom film stack 335-1 and a top film stack 335-2, respectively. The bottom film stack 335-1 and the top film stack 335-2 may include a plurality of conductor layers 454 and dielectric layers 456. The conductor layers 454 and the dielectric layers 456 in the bottom film stack 335-1 and the top film stack 335-2 alternate in the Z direction. Each conductor layer 454 may have the same thickness or have different thicknesses. Similarly, each dielectric layer 456 may have the same thickness or have different thicknesses. The conductor layers 454 may include a conductor material such as W, Co, Cu, Al, Ti, Ta, TiN, TaN, Ni, doped silicon, silicide (e.g., NiSix, WSix, CoSix, TiSix) or any combination thereof. The dielectric layers 456 may include a dielectric material such as silicon oxide, silicon nitride, silicon oxynitride, or any combination thereof.

In some implementations, the bottom layer 450 and the top layer 452 may also include a plurality of memory cells 340 (elliptically enclosed portions in the figure) of the three-dimensional non-volatile memory. The memory cells 340 may be stacked vertically into memory strings 212, which may extend through the top film stack 335-2 and the bottom film stack 335-1 and include a bottom vertical structure 212-1 and a top vertical structure 212-2. Each memory string 212 may include a channel layer 338 and a function layer 337.

In some implementations, the channel layer 338 comprises silicon, such as amorphous silicon, polysilicon, or single crystal silicon. In some implementations, the functional layer 337 may include a composite layer of a tunneling layer, a memory layer, and a block layer. Each memory string 212 may have a cylindrical shape (e.g., a column shape). According to some implementations, the channel layer 338, the tunneling layer, the memory layer, and the block layer may be arranged sequentially in a direction from the center of the column toward the outer surface.

Figure 4:
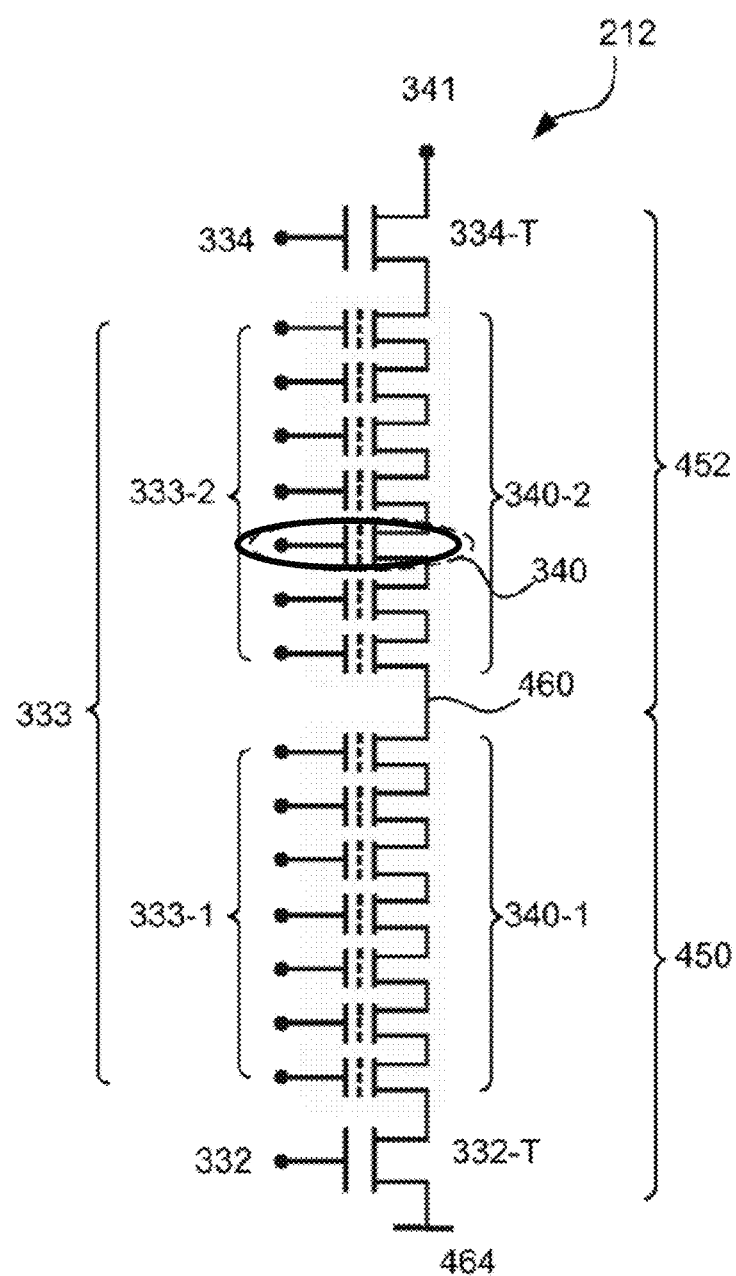
FIG. 4 is a circuit diagram of an equivalent circuit of the memory block as shown in FIG. 3.

In some implementations, the conductor layers 454 in the bottom film stack 335-1 and the top film stack 335-2 may act as a control gate for the memory cells 340 (e.g., the control gate 333 in FIG. 4). The memory strings 212 may include a lower selective gate 332 (source selective gate) at a lower end of the memory string 212 (proximate to the end of the substrate 330 in Z-direction) in the bottom layer 450. The memory strings 212 may also include a top selective gate 334 (drain selective gate) at an upper end of the memory string 212 (away from the end of the substrate 330 in the Z-direction) in the top layer 452.

In some implementations, the memory block 400 may include an epitaxial layer 458 at the lower end of the channel layer 338 of the memory string 212 in the bottom layer 450. For each memory string 212, the epitaxial layer 458 may be referred to herein as an "epitaxial plug."

The epitaxial plug 458 may contact the channel layer 338 and the array cell well body 345 in the substrate 330. The epitaxial plug 458 may be the channel for the lower selective gate 332. In some implementations, the array cell well body 345 may be P-type doped, and the doped source line region 344 may be N-type doped.

In some implementations, the memory block 400 includes insulating layers 462 in both the top layer 452 and the bottom layer 450. The insulating layers 462 may surround the memory strings 212 and provide isolation between adjacent memory strings 212.

In some implementations, the top vertical structure 212-2 of the memory string 212 in the top layer 452 may be substantially aligned with the bottom vertical structure 212-1 in the bottom layer 450. In some implementations, each memory string 212 includes a conductive plug 460 between the top vertical structure 212-2 and the bottom vertical structure 212-1. The conductive plug 460 may provide an electrical connection between the channel layer 338 located in the bottom vertical structure 212-1 and the channel layer 338 located in the top vertical structure 212-2, so that the top vertical structure 212-2 and the bottom vertical structure 212-1 may form a memory string 212 for two layers of memory blocks 400. The memory strings 212 may provide similar memory functions to the memory strings 212 in a three-dimensional non-volatile memory having a single layer. In some implementations, the conductive plug 460 includes polysilicon.

In some implementations, each film stack 335-1 and film stack 335-2 may include a stepped structure in which each conductive layer 454 terminates at a different length in the X direction. The stepped structure allows the electrical connection between the word lines and the conductive layers 454.

In some implementations, the memory block 400 includes an array common source (ACS) 464 that perpendicularly penetrates the top layer 452 and the bottom layer 450 into the substrate 330. The ACS 464 may be electrically connected to the doped source line region 344.

Thus, the ACS 464 may be electrically connected to the lower end of the memory strings 212 if the lower selective gate 332 is turned on.

Further, the three-dimensional non-volatile memory with only two layers is described herein for illustrative purposes. Similar structures and functions can be extended to a three-dimensional non-volatile memory with more than two layers.

FIG. 4 is a circuit diagram of an equivalent circuit of the memory block 400 as shown in FIG. 3.

As shown in FIG. 4, the memory block 400 may include two layers, such as the top layer 452 and the bottom layer 450. The memory block 400 may also include the memory string 212 having a plurality of stacked memory cells 340 (elliptically enclosed portions in the figure). The memory cell 340-1 is in the bottom layer 450, and the memory cell 340-2 is in the top layer 452. The memory block 400 also includes the conductive plug 460 between the top layer 452 and the bottom layer 450. Thus, the memory cell 340-2 in the top layer 452 may be electrically connected to the memory cell 340-1 in the bottom layer 450 to form the memory string 212. The memory string 212 may also include at least one field effect transistor (e.g., MOSFET) at each end which is controlled by the lower selective gate BSG 332 and the top selective gate TSG 334, respectively. The above two transistors may be referred to as lower selection transistor 332-T and top selection transistor 334-T. The stacked memory cell 340 may be controlled by the control gate 333. The control gate 333 includes a control gate 333-1 corresponding to the memory cell 340-1 and a control gate 333-2 corresponding to the memory cell 340-2. The control gate 333 is connected to word lines (not shown) of the memory block 400. The drain terminal of the top select transistors 334-T may be connected to the bit line 341, and the source terminal of the lower select transistors 332-T may be connected to the doped source line regions 344 (see FIG. 3). ACS 464 may be formed from doped source line regions 344 and may be shared by the memory strings 212 throughout the memory block 400.

Figure 5:
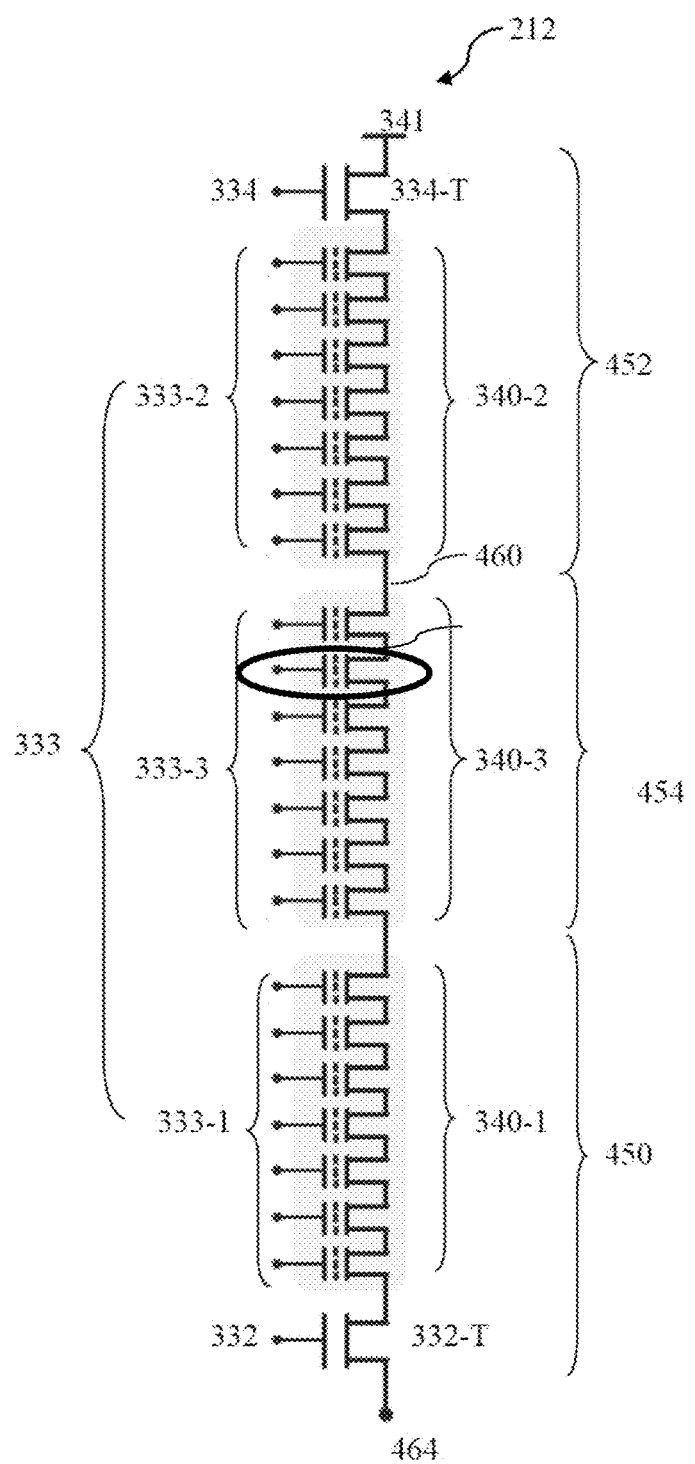
FIG. 5 is a circuit diagram of an equivalent circuit of a three-dimensional memory block according to another implementation of the present disclosure.

The physical structure and circuit equivalent structure of the memory shown in FIGS. 3 and 4 include only state of memory blocks having a top layer and a bottom layer. Further, the present disclosure also provides a three-dimensional non-volatile memory including three-dimensional memory blocks of a top layer, a middle layer, and a bottom layer and an erasure verification method for the three-dimensional non-volatile memory. FIG. 5 shows a schematic circuit diagram of a three-dimensional memory block 500 having a plurality of layers according to one implementation of the present disclosure.

As shown in FIG. 5, the three-dimensional memory block 500 may include three layers, such as a top layer 452, a middle layer 454, and a bottom layer 450. The three-dimensional memory block 500 may also include a memory string 212 having a plurality of stacked memory cells 340 (elliptically enclosed portions in the figure). The memory cell 340-1 is in the bottom layer 450, the memory cell 340-3 is in the middle layer 454, and the memory cell 340-2 is in the top layer 452. The three-dimensional memory block 500 also includes conductive plugs 460 between the top layer 452 and the middle layer 454 and between the middle layer 454 and the bottom layer 450. Thus, the memory cell 340-2 in the top layer 452 may be electrically connected with the memory cells 340-3 in the middle layer 454 and the memory cell 340-1 in the bottom layer 450 to form the memory string 212. The memory string 212 may also include at least one field effect transistor (e.g., MOSFET) at each end, which is controlled by a lower selective gate BSG 332 and a top selective gate TSG 334, respectively. The above two transistors may be referred to as lower selection transistors 332-T and top selection transistors 334-T. The stacked memory cells 340 may be controlled by control gates 333. The control gates 333 includes a control gate 333-1 corresponding to the memory cell 340-1, a control gate 333-3 corresponding to the memory cell 340-3, and a control gate 333-2 corresponding to the memory cell 340-2. The control gates 333 are connected to word lines (not shown) of the three-dimensional memory block 500. The drain terminal of the top selection transistor 334-T may be connected to the bit line 341, and the source terminal of the lower selection transistor 332-T may be connected to the doped source line region 344 (see FIG. 3). The ACS 464 may be formed from the doped source line region 344 and may be shared by the memory strings 212 throughout the memory block.

In the three-dimensional non-volatile memory, the memory cells of rows in each layer are connected to the same word line WL, and the memory cells in each column are connected in series to the same bit line BL. Each word line may correspond to a page, a memory block is composed of a plurality of pages, and a plane is further composed of a plurality of memory blocks. Further, in the three-dimensional non-volatile memory having a plurality of layers, each layer may be individually processed to efficiently read, write and erase. For example, each layer in the three-dimensional non-volatile memory may perform an erase operation and an erasure verification operation (layered erasure verification operation) independently of the other layers. In addition, read and write operations may also be performed in memory pages including memory cells sharing the same word line.

In a data erasure verification method for a three-dimensional non-volatile memory, an erasure verification operation (e.g., a layered erasure verification operation) may be performed on any layer of the memory. Specifically, an erasure verification voltage applied to any above layer may be a fixed value which may be the same as an erasure verification voltage implemented in performing an erasure verification operation on all memory cells of a memory block. However, since in the layered erasure verification operation, the pass voltage Vpass applied to the unselected layers (the layers on which the erasure verification operation is not performed) in the three-dimensional non-volatile memory is higher than the erasure verification voltage Vver applied to the selected layers (the layers on which the erasure verification operation is performed), the half-block resistance of the unselected layers is lower. The above effect of the half-block resistance will affect the result of the erasure verification operation when only the verification voltage Vver is set to a fixed value, thus causing the erase operation to fail. Further, it causes the distribution of erased memory cells to include too many memory cells with shallow erase effects.

Figure 6A:
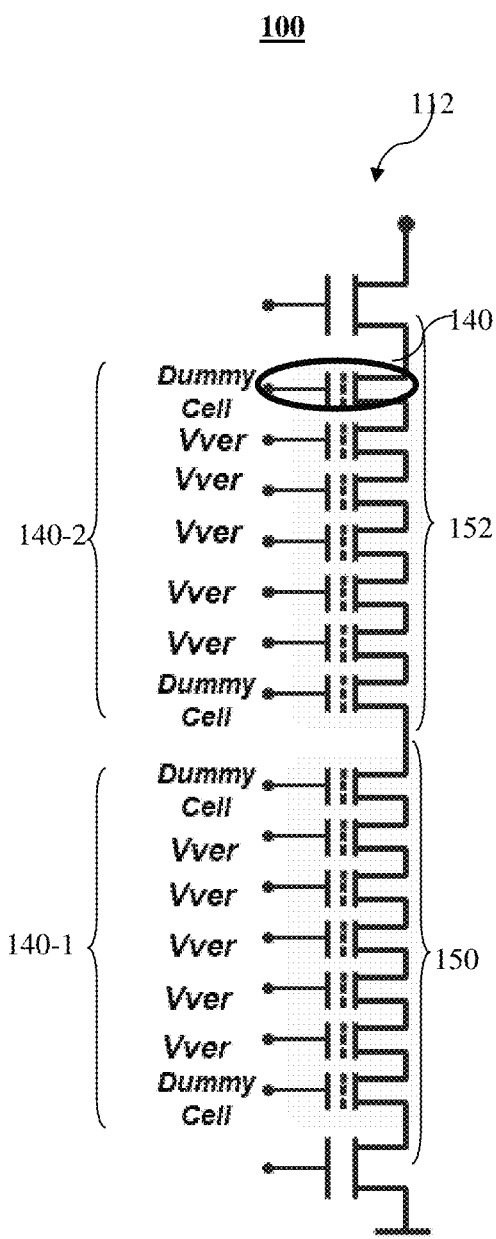
FIGS. 6A to 6C are circuit diagrams of equivalent circuits configured for a data erasure verification method for a three-dimensional non-volatile memory.
Figure 6B:
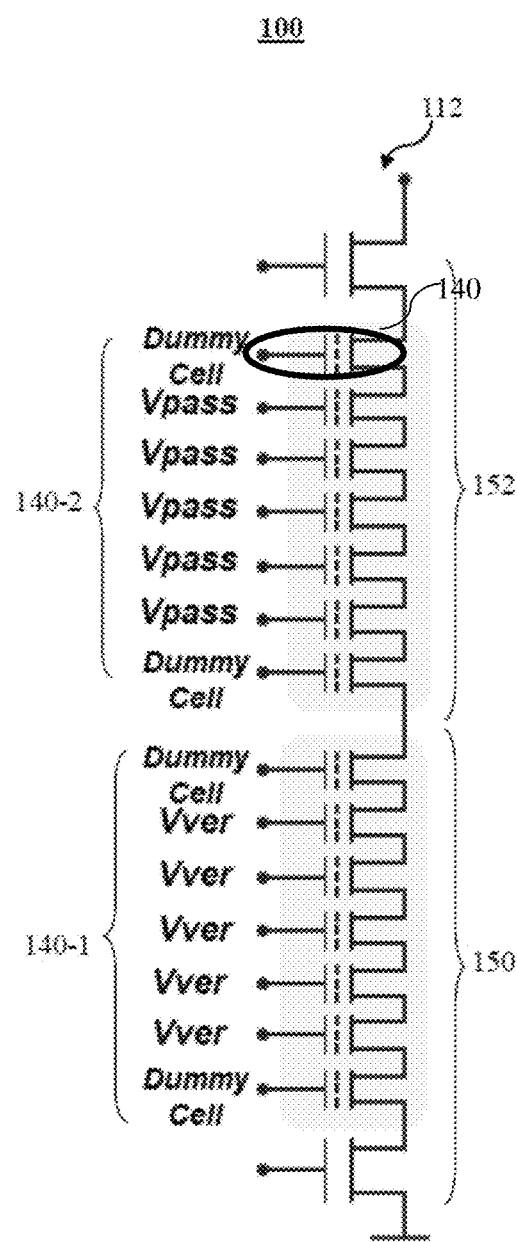
Figure 6C:
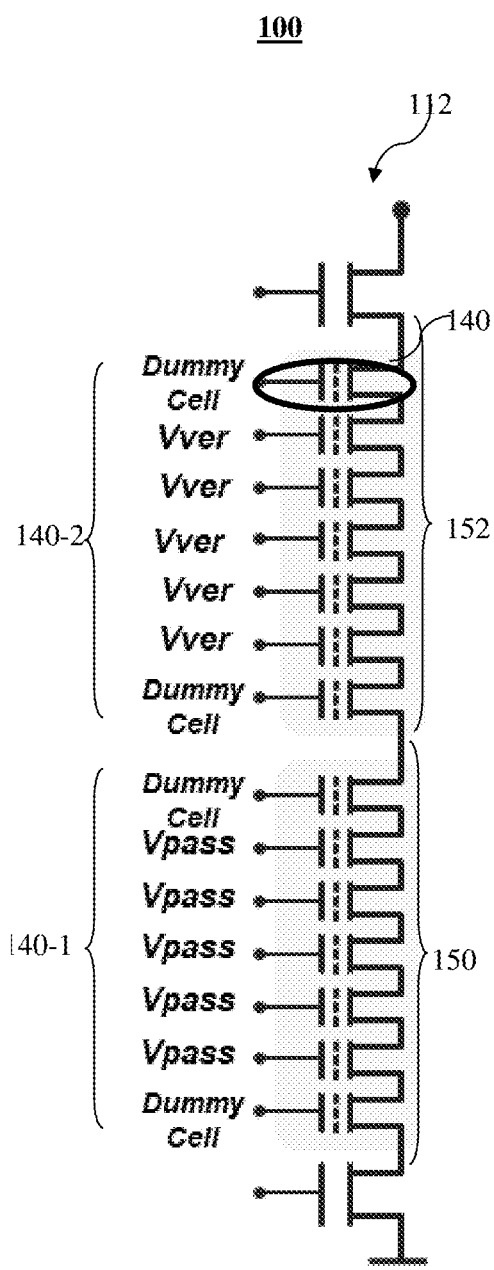

FIGS. 6A to 6C are circuit diagrams of equivalent circuits of a data erasure verification method of a three-dimensional non-volatile memory.

Specifically, as shown in FIGS. 6A-6C, as an example, the three-dimensional non-volatile memory 100 may include two layers, such as a top layer 152 and a bottom layer 150. The three-dimensional non-volatile memory 100 may also include a memory string 112 having a plurality of stacked memory cells 140. The memory cell 140-1 is in the bottom layer 150, and the memory cell 140-2 is in the top layer 152. The memory cell 140-2 in the top layer 152 may be electrically connected to the memory cell 140-1 in the bottom layer 150 to form a memory string 112.

In the erasure verification operation, the erasure verification may be performed on the memory block and each layer therein separately. For example, as shown in FIG. 6A, the erasure verification operation may be performed on a memory block including all the memory cells. In particular, an erasure verification voltage Vver may be applied to all the memory cells (the whole memory block) to verify whether the erase operation succeeds based on the applied erasure verification voltage Vver.

As an alternative, as shown in FIG. 6B, it is also possible that the layered erasure verification operation is performed first on the bottom layer 150 in the memory block. In particular, the erasure verification voltage Vver may be applied to the bottom layer 150 while a pass voltage Vpass may be applied to the top layer 152 (the layer on which the erasure verification operation is not performed) to verify whether the erase operation succeeds based on the applied erasure verification voltage Vver. The erasure verification voltage Vver applied at the bottom layer 150 may be the same as the erasure verification voltage Vver applied to the memory block described above.

As another alternative, as shown in FIG. 6C, it is also possible that the layered erasure verification operation is performed first on the top layer 152 in the memory block. In particular, the erasure verification voltage Vver may be applied to the top layer 152 while the pass voltage Vpass may be applied to the bottom layer 150 (the layer on which the erasure verification operation is not performed) to verify whether the erase operation succeeds based on the applied erasure verification voltage Vver. The erasure verification voltage Vver applied at the top layer 152 may be the same as the erasure verification voltage Vver applied to the memory block described above.

Figure 7:
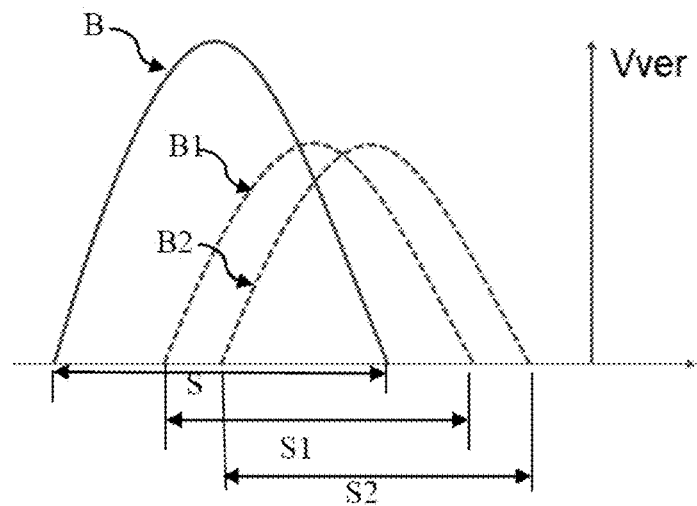
FIG. 7 is a relationship graph showing an erasure verification voltage obtained according to a data erasure verification method versus the distribution of the erased memory cells.

FIG. 7 is a relationship graph showing an erasure verification voltage obtained according to a data erasure verification method versus the distribution of the erased memory cells.

As described above, in an erasure verification operation, the erasure verification voltage Vver, which is independently applied to the top layer, the bottom layer, and the memory block, can be set to be the same. In other words, the operation for erasure verification may be performed by applying a single erasure verification voltage Vver to its corresponding memory cell. Whether the erase operation succeeds or not may be determined by sensing the on-off state of the memory cells.

As shown in FIG. 7, curves B, B1 and B2 are relationship curves of the erasure verification voltage versus the distribution of the erased memory cells during independently implementing the erasure verification operations on the memory block, the top layer, and the bottom layer, respectively. In the erasure verification operation, when the erasure verification voltages applied to the top layer, the bottom layer, and the memory block are set to be the same, it can be determined that their respective distributions of the erased memory cells are not the same. Specifically, after the erasure verification operation is performed on the memory block, the maximum range of its distributions of the erased memory cells is S. After the erasure verification operation is performed on the top layer, the maximum range of its distributions of the erased memory cells is S1. After the erasure verification operation is performed on the bottom layer, the maximum range of its distributions of the erased memory cell is S2.

In addition, when the erase operation is performed on a memory block, if only a part of the word lines of the memory block are written with data and the rest are not used, then after new data is written to the memory block, the probability of data bit inversion will increase when the user reads the data, that is, the probability of data error will increase, due to the electric characteristics of the hardware. This phenomenon is called Shallow Erase.

In a layered erasure verification operation (the operation is performed only on at least one layer of the memory block), the layers of the memory block on which the erasure verification operation is to be performed is applied with the erasure verification voltage Vver. Other layers of the memory block on which the erasure verification operation is not performed are applied with the pass voltage Vpass. When the erasure verification voltage Vver is set to a fixed value, other layers on which the erasure verification operation is not performed will generally have lower half-block resistance because the pass voltage Vpass is generally higher than the erasure verification voltage Vver. The resistance of the source and drain of the memory block will change accordingly, which will further affect the corresponding current flowing through the memory cell between the source terminal and the drain terminal, and the threshold voltage Vth of the memory cell will be changed (half-block resistance effect). Therefore, the above half-block resistance effect will affect the result of the erase operation when only the erasure verification voltage is set to a fixed value in the layered erasure verification operation.

Further, the distribution of erased memory cells after the layered erasure verification operation includes too many memory cells having shallow erase effects. For example, the maximum range S1 of the distribution of the erased memory cells after the erasure verification operation is performed on the top layer, and the maximum range S2 of the distribution of the erased memory cells after the erasure verification operation is performed on the bottom layer in FIG. 7 both fall in the memory cell range Sa with shallow erase effect.

Based on the above problems, when executing the layered erasure verification operation, an implementation of the present disclosure selects the corresponding erasure verification voltage Vver by using system rules and separately applies it to the selected layer (the layered erasure verification operation), which can improve the distribution of the erased memory cells after the layered erasure verification operation to be the same as the distribution of the erased memory cells after the full-block erasure verification operation, and reduce the shallow erase area in the distribution of the erased memory cells after the layered erasure verification operation.

Figure 9:
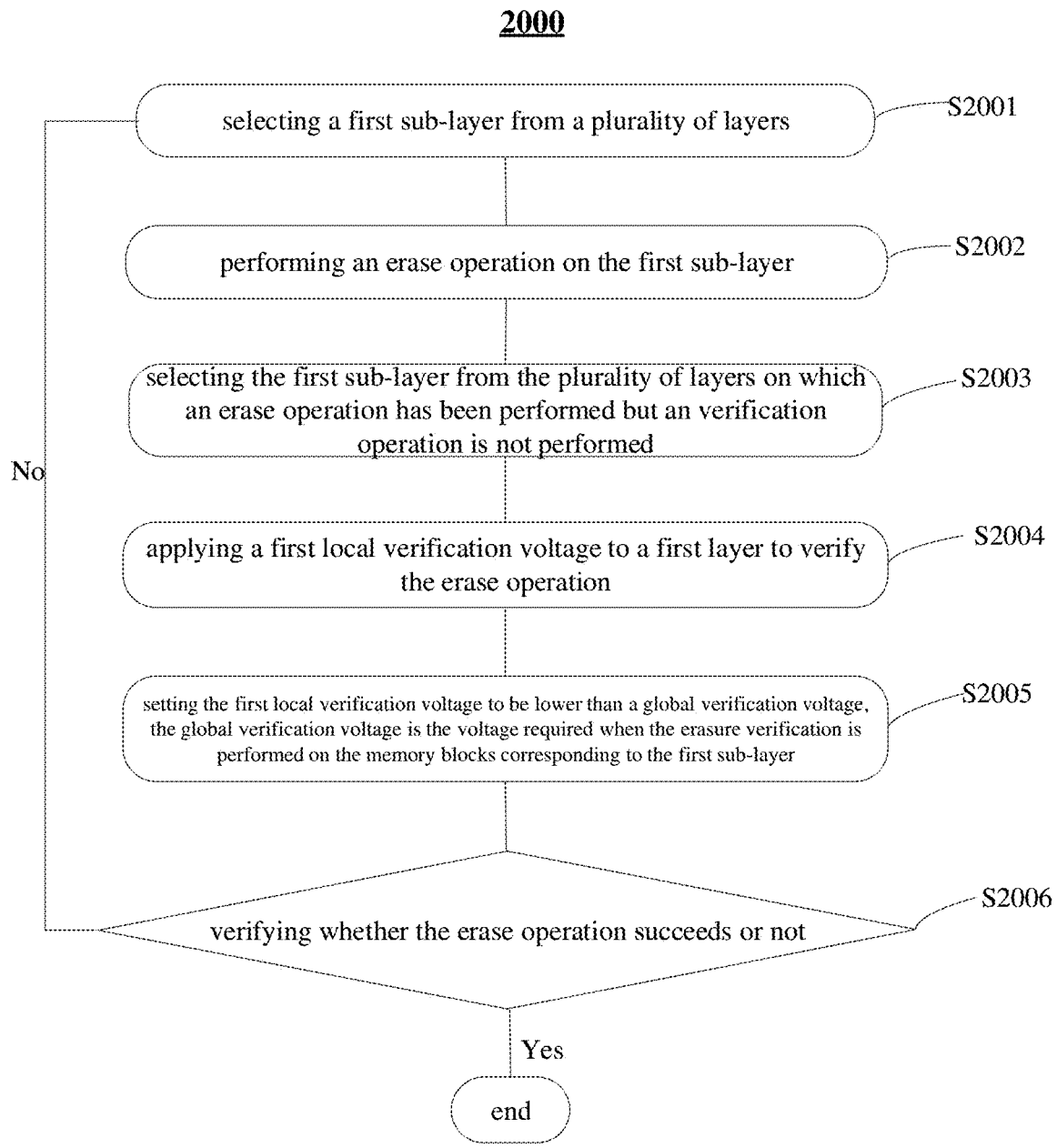
FIG. 9 is a flowchart of a data erase method for a three-dimensional non-volatile memory according to an implementation of the present disclosure.

A data erase method and a data erasure verification method configured for a memory according to implementations of the present disclosure will be described below based on the three-dimensional non-volatile memory of the present disclosure shown in FIG. 2 and the physical and circuit structures of the memory shown in FIG. 3, FIG. 4 and FIG. 5 with reference to FIG. 1 and FIG. 9. It should be understood that although the physical and circuit structure shown in FIG. 3, FIG. 4 and FIG. 5 are employed in describing the data erase method and the data erasure verification method, it is only exemplary, and the present disclosure is not limited thereto.

In addition, the data erase operation mentioned in the erasure verification method of the three-dimensional non-volatile memory provided by the implementation of the present disclosure is only an erase operation performed on the data of the three-dimensional non-volatile memory and does not include an erasure verification operation.

FIG. 1 is a flowchart of a data erasure verification method 1000 for a three-dimensional non-volatile memory according to an implementation of the present disclosure. As shown in FIG. 1, the data erasure verification method 1000 for the three-dimensional non-volatile memory includes:

Step S1: selecting a first layer from the plurality of layers of the memory block on which an erase operation has been performed, and a verification operation has not been performed to perform layered erasure verification.

Step S2: applying a first local verification voltage to the first layer to verify the erase operation performed on the first layer.

Step S3: setting the first local verification voltage to be lower than the global verification voltage, wherein the global verification voltage is the voltage required for performing full-block erasure verification on the memory block corresponding to the first layer.

The above-described steps will be described in detail below so that the specific implementation of the above-described method 1000 will become more apparent to those skilled in the art.

Step S1

In step S1, the three-dimensional non-volatile memory may include a plurality of memory blocks as shown in FIG. 4. The memory blocks may include a plurality of memory strings 212 consisting of a top layer 452 and a bottom layer 450. Alternatively, as shown in FIG. 5, the memory block may also include a plurality of memory strings 212 consisting of memory cells in the top layer 452, the middle layer 454, and the bottom layer 450. Any layer of the memory string on which the erase operation has been performed and the verification operation has not been performed may be selected as the first layer to perform the erasure verification operation. The layer erasure verification operation (layered erasure verification operation) refers to that an erasure verification operation is performed only on at least one layer of the memory block and not on all memory blocks.

Step S2

In Step S2, applying a first local verification voltage to the first layer to verify the erase operation includes the control unit 210 controlling the voltage generating unit 220 to apply the local erasure verification voltage (Vver) to the first layer of the memory block to be verified while the lower selection transistor 332-T is kept on, and performing the data erasure verification operation by the first determination unit 241 corresponding to the first layer among the determination units of the layered erasure verification module 240. The local erasure verification voltage may be applied simultaneously to all the word lines WL of the first layer that have been erased in advance or sequentially one by one to these word lines WL.

After the erasure verification Phase (VER) is enabled, the control unit 210 may control the voltage generating unit 220 to apply the local erasure verification voltage to the word line WL of the first layer that has been erased and is to be verified. The voltage of the word line WL of the first layer rises due to the application of the local erasure verification voltage. For example, the voltage of the word line WL may rise from the ground to about 2.2 V. At this time, the lower selection transistor 332-T is always kept on due to the application of the gate bias voltage while the channel is always in the discharge state.

Step S3

In Step S3, the local verification voltage applied to the first layer that has been erased, but no verification operation is performed according to an implementation of the present disclosure can be adjusted so as to satisfy that the local verification voltage is lower than the global verification voltage required for performing the full-block erasure verification on the memory block corresponding to the first layer.

Specifically, in an implementation of the present disclosure, while the control unit 210 may control the voltage generating unit 220 to apply the local erasure verification voltage to the first layer of the memory block on which the erasure verification operation is to be performed, it may also control the voltage generating unit 220 to apply the voltage Vpass to other layers in the memory block on which the erasure verification operation is not performed.

In an implementation of the present disclosure, the memory block includes the bottom layer 450 and the top layer 452 sequentially stacked in the direction perpendicular to the substrate 330. The control unit 210 may control the voltage generating unit 220 to set the local erasure verification voltage applied to the bottom layer 450 to be lower than the global erasure verification voltage applied to all the memory cells (340-1 and 340-2) of the memory block.

Alternatively, the control unit 210 may also control the voltage generating unit 220 to set the local erasure verification voltage applied to the top layer 452 to be lower than the global erasure verification voltage applied to all the memory cells (340-1 and 340-2) of the memory block.

Further, in another implementation of the present disclosure, the memory block includes the bottom layer 450 and the top layer 452 sequentially stacked in the direction perpendicular to the substrate 330. The control unit 210 may control the voltage generating unit 220 to set the local erasure verification voltage applied to the bottom layer 450 to be lower than the global erasure verification voltage applied to all the memory cells (340-1 and 340-2) of the memory block, while setting the local erasure verification voltage applied to the top layer 452 to be lower than the global erasure verification voltage applied to all the memory cells (340-1 and 34-2) of the memory block, and setting the local erasure verification voltage applied to the top layer 452 to be lower than the erasure verification voltage applied to the bottom layer 450.

In addition, in another implementation of the present disclosure, prior to the step of selecting the first layer in the memory block comprising two layers on which the erase operation has been performed, the method further comprises: performing, by the control circuit, the write operation or the erase operation on the second layer of the memory block. For example, the first local verification voltage with a first voltage value may be applied to the first layer after the write operation is performed on the second layer; or the first local verification voltage with a second voltage value may be applied to the first layer after the erase operation is performed on the second layer. The first voltage value should be higher than the second voltage value in the above two states.

In another implementation of the present disclosure, the memory block includes a bottom layer 450, a middle layer 454, and a top layer 452 sequentially stacked in the direction perpendicular to the substrate 330. The bottom layer 450 is proximate to the substrate 330. Correspondingly adjusting the local erasure verification voltage in the erase method for the three-dimensional non-volatile memory may include:

The control unit 210 may control the voltage generating unit 220 to set the local erasure verification voltage applied to the bottom layer 450 to be lower than the erasure verification voltage applied to all the memory cells of the memory block.

As an alternative, the control unit 210 may also control the voltage generating unit 220 to set the local erasure verification voltage applied to the top layer 452 to be lower than the global erasure verification voltage applied to all the memory cells (340-1, 340-2 and 340-3) of the memory block.

As another alternative, the control unit 210 may also control the voltage generating unit 220 to set the local erasure verification voltage applied to the middle layer 454 to be lower than the global erasure verification voltage applied to all the memory cells (340-1, 340-2 and 340-3) of the memory block.

Further, in another implementation of the present disclosure, the memory block includes a bottom layer 450, a middle layer 454, and a top layer 452 sequentially stacked in the direction perpendicular to the substrate 330. The bottom layer 450 is proximate to the substrate 330. Correspondingly adjusting the local erasure verification voltage in the erasure verification method for the three-dimensional non-volatile memory may include: the control unit 210 may control the voltage generating unit 220 to set the local erasure verification voltage applied to the bottom layer 450 to be lower than the global erasure verification voltage applied to all the memory cells (340-1, 340-2 and 340-3) of the memory block, and the local erasure verification voltage applied to the top layer 452 to be lower than the global erasure verification voltage applied to all the memory cells (340-1, 340-2 and 340-3) of the memory block, and the local erasure verification voltage applied to the top layer 452 to be lower than the local erasure verification voltage applied to the bottom layer 450.

Further, in another implementation of the present disclosure, the memory block includes a bottom layer 450, a middle layer 454, and a top layer 452 sequentially stacked in the direction perpendicular to the substrate 330. The bottom layer 450 is proximate to the substrate 330. Correspondingly adjusting the local erasure verification voltage in the erasure verification method for the three-dimensional non-volatile memory may include: the control unit 210 controlling the voltage generating unit 220 to set the local erasure verification voltage applied to the bottom layer 450, the middle layer 454 and the top layer 452 respectively to be lower than the global erasure verification voltage applied to all the memory cells (340-1, 340-2 and 340-3) of the memory block. Meanwhile, the controller also controls the voltage generating unit 220 to set the local erasure verification voltage applied to the top layer 452 to be lower than the local erasure verification voltage applied to the middle layer 454 and the local erasure verification voltage applied to the middle layer 454 to be lower than the local erasure verification voltage applied to the bottom layer 450.

Further, in another implementation of the present disclosure, prior to the step of selecting the first layer in the memory block comprising three layers on which the erase operation has been performed, the method further includes: selecting a second layer of the three layers of the memory block, such as the bottom layer 450, and performing the write operation or the erase operation on the second layer. For example, the first local verification voltage with a third voltage value may be applied to the first layer (e.g., the top layer 452) after the write operation is performed on the second layer; or the first local verification voltage with a fourth voltage value can be applied to the first layer after the erase operation is performed on the second layer. The third voltage value should be higher than the fourth voltage value in the above two states.

Further, in another implementation of the present disclosure, prior to the step of selecting the first layer in the memory block comprising three layers on which the erase operation has been performed, the method further includes: selecting a third layer of the three layers of the memory block, such as a middle layer 454 which may be different from the second layer in the above-described implementation. The third layer may also be a remaining layer after the first layer and the second layer are selected in the above implementation. A write operation or erase operation may be performed on the third layer. For example, the first local verification voltage with a fifth voltage value may be applied to the first layer (e.g., the top layer 452) after the write operation is performed on the third layer; or the first local verification voltage with a sixth voltage value may be applied to the first layer after the erase operation is performed on the third layer. The fifth voltage value should be higher than the sixth voltage value in the above two states.

In addition, as another alternative, in another implementation of the present disclosure, prior to the step of selecting the first layer in the memory block comprising three layers on which the erase operation has been performed, the method may further include: selecting a third layer of the three layers of the memory block, such as a middle layer 454 which may be different from the second layer in the above implementation. The third layer may also be a remaining layer after the first layer and the second layer are selected in the above implementation. A write operation or erase operation may be performed on the third layer. For example, the first local verification voltage with a seventh voltage value may be applied to the first layer (e.g., the top layer 452) after the write operation is performed on the third layer; or the first local verification voltage with an eighth voltage value may be applied to the first layer after the erase operation is performed on the second layer and the third layer (e.g., the middle layer 454 and the bottom layer 450). The seventh voltage value should be higher than the eighth voltage value in the above two states.

Figure 8:
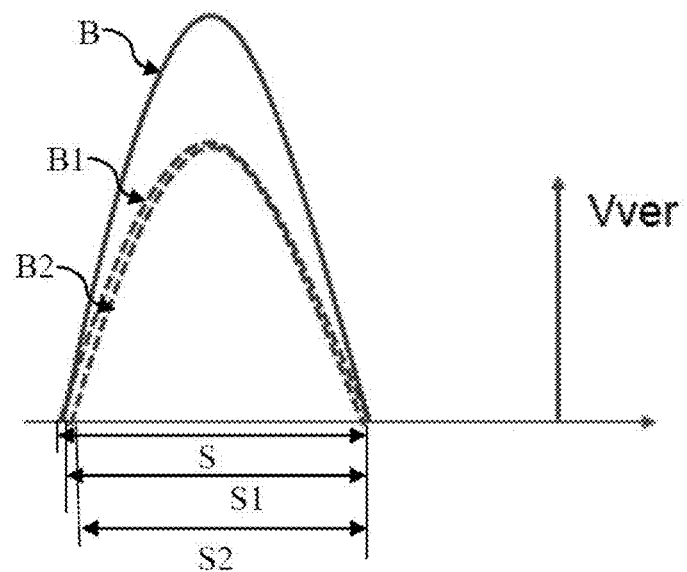
FIG. 8 is a relationship graph showing an erasure verification voltage obtained according to a data erasure verification method for a three-dimensional non-volatile memory provided in the present disclosure versus the distribution of the erased memory cells.

FIG. 8 is a relationship graph of an erasure verification voltage obtained according to a data erasure verification method for a three-dimensional non-volatile memory provided by the present disclosure versus the distribution of the erased memory cells.

As shown in FIG. 8, the curves B, B1, and B2 are the relationship curves of erasure verification voltages for selected layers (the memory block, the top layer, and the bottom layer) versus the distribution of the erased memory cells after performing the data erasure verification method provided according to the present disclosure, respectively. In the above-mentioned erasure verification operation, the local erasure verification voltages applied to selected layers on which the erasure verification operation is to be performed (e.g. the top layer and the bottom layer) are respectively selected to satisfy that the local erasure verification voltages are lower than the global verification voltages required for performing the erasure verification for the memory block, and their respective distributions of the erased memory cells can be adjusted to be the same (S is the maximum range of the distribution of the erased memory cells after the erasure verification operation is performed on the memory block, S1 is the maximum range of the distribution of erased memory cells after the erasure verification operation is separately performed on the top layer, and S2 is the maximum range of the distribution of the erased memory cells after the erasure verification operation is separately performed on the bottom layers), reducing the number of memory cells with shallow erase effect in the maximum range of the distribution of the erased memory cells after the layered erasure verification operation.

Particularly, although in the data erasure verification operation provided by the implementation of the present disclosure, other layers in the memory block on which the erasure verification operation is not performed are also applied with the pass voltage Vpass and the pass voltage Vpass is higher than the local erasure verification voltage Vver. However, the local erasure verification voltage of the selected layer on which erasure verification is to be performed may be selected and satisfies that the local erasure verification voltage is lower than the global verification voltage required for performing the erasure verification on the memory block. Under the combined effect of the local erasure verification voltage Vver and the pass voltage Vpass, the resistance of the source and drain of the memory block can be maintained at a fixed value without affecting the corresponding current flowing through the memory cell between the source terminal and the drain terminal. Therefore, the possible changes in the threshold voltage Vth (half block resistance effect) of the memory cells are effectively avoided. Further, due to the stability of the threshold voltage Vth of the memory cells, the occurrence of memory cells with shallow erase effects in the erased memory cells can be effectively avoided.

In addition, according to an aspect of the present disclosure, the present disclosure also provides an erase method 2000 for a three-dimensional non-volatile memory. The data erase method 2000 for the three-dimensional non-volatile memory includes:

Step S2001: selecting a first layer from a plurality of layers.
Step S2002: performing an erase operation on the first layer.
Step S2003: selecting the first layer from the plurality of layers on which the erase operation has been performed.
Step S2004: applying a first local verification voltage to the first layer to verify the erase operation.
Step S2005: setting the first local verification voltage to be lower than the global verification voltage, which is the voltage required for performing the erasure verification for the memory block corresponding to the first layer.
Step 2006: the erase step ends if the erase operation succeeds; and the erase operation and the erasure verification operation are repeated if the erase operation fails, until the erase operation succeeds.

Specifically, in steps S2001 and S2002, the memory block may include a plurality of layers, and at least one layer (the first layer) of a plurality of layers may be arbitrarily selected for erase operations. A bias voltage may be applied to the lower selection transistor 332-T of at least one memory block to turn it on under the control of the control unit 210 in response to performing the erase operation on the first layer of the memory block. For example, the control unit 210 may control the voltage generating unit 220 to apply the bias voltage to the gate 332 of the lower selection transistor 332-T of the memory block, causing the lower selection transistor 332-T to be turned on. In particular, the bias voltage may be applied to the gate 332 of the lower selection transistor 332-T of the memory block during a voltage drop of the array cell well body 345 in the latter half of the erase process and kept constant until subsequent erasure verification begins.

As an example, the bias voltage may be applied to the gate 332 of the lower selection transistor 332-T of the memory block to turn it on after the erase voltage is applied to the memory block for a predetermined time. A gate bias voltage is applied to the lower selection transistor 332-T of the memory block to turn it on, for example, at the end of the erase operation and during the erase voltage drop. Further, the bias voltage may be applied to the lower selection transistor 332-T at the end of the erase operation and before the gate voltage of the lower selection transistor 332-T drops to a threshold to turn it off. In one particular implementation, the bias voltage applied is lower than the erase voltage configured for the erase operation. For example, the erase voltage may be about 20V, and the bias voltage may be about 6.5V.

Since the contents and structures involved in describing the erasure verification method 1000 for the three-dimensional non-volatile memory above may be fully or partially applicable to the steps S2003 to S2005 described herein, the contents related to or similar thereto will not be repeated.

In step S2006, the determination unit of the layered erasure verification module 240 may acquire the current voltage of the memory block word line WL, and determine whether the layered erasure verification passes according to whether the acquired current voltage reaches the target value. Specifically, whether a current flows through the memory string 212 can be sensed after applying the erasure verification voltage Vver to the layer word line WL on which the erasure verification is to be performed and the pass voltage Vpass to the layer word line WL on which the erasure verification is not performed. The erase operation is considered as being successful, and the layered erasure verification operation is passed if the current is sensed to flow through the memory string 212. Otherwise, the erase is considered as being unsuccessful, and the layered erasure verification operation is not passed. In step 2007, if it is determined that the data erase operation failed, the method returns to step 2001 to perform a second data erase operation by the verification unit of the layered erasure verification module 240, and to perform a second erasure verification operation by the above determination unit for the layer on which once again the data erase operation is performed, until the verification passes.

In accordance with the erase method for the three-dimensional non-volatile memory provided according to an implementation of the present disclosure, the local erasure verification voltage of the selected layer on which the erasure verification is to be performed may be selected and satisfies that the local erasure verification voltage is lower than the global verification voltage required for performing a full-block erasure verification for the memory block. Under the combined effect of the local erasure verification voltage and the pass voltage (applied to the layer on which the erasure verification operation is not performed), the resistance of the source and drain of the memory block can be maintained at a fixed value without affecting the corresponding current flowing through the memory cell between the source terminal and the drain terminal. Therefore, the possible changes in the threshold voltage (half block resistance effect) of the memory cells are effectively avoided. Further, due to the stability of the threshold voltage of the memory cells, the occurrence of memory cells with shallow erase effects in erased memory cells can be effectively avoided.

The above description is only an implementation of the present disclosure and a description of the technical principles used. It should be understood by those skilled in the art that the scope of protection referred to in the present disclosure is not limited to technical solutions formed by specific combinations of the above technical features, but also includes other technical solutions formed by any combination of the above technical features or their equivalents without departing from the technical concept. For example, the technical scheme formed by replacing the above features with the technical features with similar functions disclosed in the present disclosure (but not limited to).

What is claimed is:

1. A method for data erasure verification of a three-dimensional non-volatile memory, the three-dimensional non-volatile memory comprising memory blocks, the memory blocks comprising layers, the method comprising:
   selecting a first layer from the layers on which an erase operation has been performed; and
   applying a first local verification voltage to a word line corresponding to the first layer to verify the erase operation for the first layer,
   wherein when a full block erasure verification is performed on the memory blocks corresponding to the first layer, a voltage applied to the word line corresponding to the memory blocks is a global verification voltage, and the first local verification voltage is lower than the global verification voltage.

2. The method of claim 1, wherein the memory blocks comprise two layers, and the method further comprises:
   selecting a second layer from the layers on which an erase operation has been performed; and
   applying a second local verification voltage to a word line corresponding to the second layer to verify the erase operation for the second layer,
   wherein the second local verification voltage is lower than the global verification voltage.

3. The method of claim 2, wherein
   the first layer is a top layer, and the second layer is a bottom layer, the three-dimensional non-volatile memory further comprises a substrate, and the bottom layer is proximate to the substrate; and
   the first local verification voltage is lower than the second local verification voltage.

4. The method of claim 3, wherein applying the first local verification voltage to the word line corresponding to the first layer comprises:
   applying the first local verification voltage with a first voltage value to the word line corresponding to the first layer in response to memory cells corresponding to the second layer being in a programming state; and
   applying the first local verification voltage with a second voltage value to the word line corresponding to the first layer in response to the memory cells corresponding to the second layer being in an erasing state, the first voltage value being higher than the second voltage value.

5. The method of claim 1, wherein the memory blocks comprise three layers, and the method further comprises:
   selecting a second layer from the layers on which an erase operation has been performed;
   applying a second local verification voltage to a word line corresponding to the second layer to verify the erase operation for the second layer, the second local verification voltage being lower than the global verification voltage;
   selecting a third layer from the layers on which an erase operation has been performed; and
   applying a third local verification voltage to a word line corresponding to the third layer to verify the erase operation for the third layer, the third local verification voltage being lower than the global verification voltage.

6. The method of claim 5, wherein
   the first layer is a top layer, the second layer is a middle layer, and the third layer is a bottom layer, the three-dimensional non-volatile memory further comprises a substrate, and the bottom layer is proximate to the substrate:
   the first local verification voltage is lower than the second local verification voltage; and
   the second local verification voltage is lower than the third local verification voltage.

7. The method of claim 6, wherein applying the first local verification voltage to the word line corresponding to the first layer comprising:
   applying the first local verification voltage with a third voltage value to the word line corresponding to the first layer in response to memory cells corresponding to the second layer being in a programming state; and
   applying the first local verification voltage with a fourth voltage value to the word line corresponding to the first layer in response to the memory cells corresponding to the second layer being in an erasing state, the third voltage value being higher than the fourth voltage value.

8. The method of claim 6, wherein applying the first local verification voltage to the word line corresponding to the first layer comprising:
   applying the first local verification voltage with a fifth voltage value to the word line corresponding to the first layer in response to memory cells corresponding to the third layer being in a programming state; and
   applying the first local verification voltage with a sixth voltage value to the word line corresponding to the first layer in response to the memory cells corresponding to the third layer being in an erasing state, the fifth voltage value being higher than the sixth voltage value.

9. The method of claim 6, wherein applying the first local verification voltage to the word line corresponding to the first layer comprising:
   applying the first local verification voltage with a seventh voltage value to the word line corresponding to the first layer in response to memory cells corresponding to the third layer being in a programming state; and applying the first local verification voltage with an eighth voltage value to the word line corresponding to the first layer in response to the memory cells corresponding to both the second layer and the third layer being in an erasing state, the seventh voltage value being higher than the eighth voltage value.

10. A method for erasing data of a three-dimensional non-volatile memory comprising layers, the method comprising:

selecting a first layer from the layers;
performing an erase operation on the first layer;
applying a first local verification voltage to a word line corresponding to the first layer to verify the erase operation for the first layer; and
ending an erase operation in response to the erase operation being verified successfully,
wherein when a full block erasure verification is performed on memory blocks corresponding to the first layer, a voltage applied to the word line corresponding to memory blocks is a global verification voltage, and the first local verification voltage is lower than the global verification voltage.

11. The method of claim 10, further comprising:
repeating the erase operation in response to the erase operation being verified unsuccessfully.

12. A three-dimensional non-volatile memory, comprising:

a memory array comprising memory blocks, the memory blocks comprising layers;
a peripheral circuit coupled to the memory array and configured to:
  select a first layer from the f layers on which an erase operation has been performed; and
  apply a first local verification voltage to a word line corresponding to the first layer to verify the erase operation for the first layer,
  wherein when a full block erasure verification is performed on the memory blocks corresponding to the first layer, a voltage applied to the word line corresponding to the memory blocks is a global verification voltage, and the first local verification voltage is lower than the global verification voltage.

13. The three-dimensional non-volatile memory of claim 12, wherein the peripheral circuit comprises:

a controller configured to select a first layer from the layers on which an erase operation has been performed;
a voltage generating unit configured to generate a first local verification voltage under the control of the controller; and
a row driver configured to apply the first local verification voltage to the word line corresponding to the first layer under control of the controller.

14. The three-dimensional non-volatile memory of claim 13, wherein the voltage generating unit is further configured to generate a pass voltage under control of the controller; and
the row driver is further configured to apply the pass voltage to word lines corresponding to remaining layers in the memory blocks other than the first layer under control of the controller.

15. The three-dimensional non-volatile memory of claim 13, wherein the memory blocks comprise two layers;
the controller is further configured to select a second layer from the layers on which an erase operation has been performed;
the voltage generating unit is further configured to generate a second local verification voltage under control of the controller; and
the row driver is further configured to apply the second local verification voltage to the word line corresponding to the second layer under control of the controller, the second local verification voltage being lower than the global verification voltage.

16. The three-dimensional non-volatile memory of claim 15, further comprising a substrate, wherein the first layer is a top layer and the second layer is a bottom layer, and the bottom layer is proximate to the substrate, and
the first local verification voltage is lower than the second local verification voltage.

17. The three-dimensional non-volatile memory of claim 13, wherein the memory blocks comprise three layers;
the controller is further configured to select a second layer from the layers on which an erase operation has been performed;
the voltage generating unit is further configured to generate a second local verification voltage under control of the controller;
the row driver is further configured to apply the second local verification voltage to a word line corresponding to the second layer under control of the controller;
the second local verification voltage is lower than the global verification voltage;
the controller is further configured to select a third layer from the layers on which an erase operation has been performed;
the voltage generating unit is further configured to generate a third local verification voltage under control of the controller;
the row driver is further configured to apply the third local verification voltage to a word line corresponding to the third layer under control of the controller; and
the third local verification voltage is lower than the global verification voltage.

18. The three-dimensional non-volatile memory of claim 17, further comprising a substrate, wherein the first layer is a top layer, the second layer is a middle layer, the third layer is a bottom layer, and the bottom layer is proximate to the substrate;
the first local verification voltage is lower than the second local verification voltage; and
the second local verification voltage is lower than the third local verification voltage.

19. The three-dimensional non-volatile memory of claim 18, wherein the three-dimensional non-volatile memory is a three-dimensional NAND memory.

* * * * *